United States Patent
Kuo (10) Patent No.: US 7,319,610 B2
(45) Date of Patent: Jan. 15, 2008

(54) MTP STORAGE MEDIUM AND ACCESS ALGORITHM METHOD WITH TRADITIONAL OTP

(75) Inventor: Chien-Liang Kuo, Hsin-Chu (TW)

(73) Assignee: eMemory Technology Inc., Hsin-Chu (TW)

(*) Notice: Subject to any disclaimer, the term of this patent is extended or adjusted under 35 U.S.C. 154(b) by 259 days.

(21) Appl. No.: 11/306,253

(22) Filed: Dec. 21, 2005

(65) Prior Publication Data

US 2006/0285385 A1    Dec. 21, 2006

Related U.S. Application Data

(60) Provisional application No. 60/595,215, filed on Jun. 16, 2005.

(51) Int. Cl.
*G11C 16/22* (2006.01)
(52) U.S. Cl. ............. 365/185.04; 365/104; 365/189.07
(58) Field of Classification Search ............ 365/185.04
See application file for complete search history.

(56) References Cited

U.S. PATENT DOCUMENTS

| | | | | |
|---|---|---|---|---|
| 5,036,486 A | * | 7/1991 | Noguchi et al. | 365/49 |
| 5,574,684 A | * | 11/1996 | Tomoeda | 365/185.04 |
| 5,838,613 A | * | 11/1998 | Takizawa | 365/185.04 |
| 6,819,599 B2 | * | 11/2004 | Schaefer | 365/189.07 |
| 6,834,022 B2 | * | 12/2004 | Derner et al. | 365/222 |
| 2007/0045744 A1 | * | 3/2007 | Ito | 257/355 |

* cited by examiner

*Primary Examiner*—Tan T. Nguyen
(74) *Attorney, Agent, or Firm*—Winston Hsu (57) ABSTRACT

A method for performing multi-programmable function with one-time programmable (OTP) memories includes: generating a newest word in a OTP memory array; receive a word-to-be-record; comparing the newest word and the word-to-be-record; and according to a result, recording bit information between the newest word and the word-to-be-record into the OTP memory array. Therefore the method and apparatus can simplify hardware circuit and reduce production costs of additional memory units, furthermore the memory count is not limited to only OTP memory block count.

24 Claims, 6 Drawing Sheets

| A | B | Y |
|---|---|---|
| 1 | 1 | 1 |
| 1 | 0 | 0 |
| 0 | 1 | 0 |
| 0 | 0 | 1 |

MTP STORAGE MEDIUM AND ACCESS ALGORITHM METHOD WITH TRADITIONAL OTP

CROSS REFERENCE TO RELATED APPLICATIONS

This application claims the benefit of U.S. Provisional Application No. 60/595,215, filed Jun. 16, 2005, and included herein by reference.

BACKGROUND OF THE INVENTION

1. Field of the Invention

The present invention relates to a method for performing multi-programmable function with one-time programmable (OTP) memory, and more particularly, to a method of recording data conversion between words for reducing addressing operations and increasing record counts.

2. Description of the Prior Art

Memory is a type of storage device manufactured utilizing a semiconductor technology. Memory can be classified into two types: volatile memory and non-volatile memory. Data stored in volatile memory is immediately erased once power supply is cut off. DRAM and SRAM are the most common types of volatile memories. Unlike volatile DRAM and SRAM memories, data stored in non-volatile memory can hold its content without the need of a power supply. In other words, the stored data in non-volatile memories can be retrieved after the power supply is re-connected. Read only memory (ROM), programmable ROM (PROM), erasable PROM (EPROM), one time PROM (OTP), electrically EPROM (EEPROM), and flash memory are the common types of non-volatile memories.

The operational theories of the above-mentioned memories are well known to those skilled in the art and therefore will not be reiterated. A flash memory can operate at a highly efficient speed but it can still work after one hundred thousand erase/programming operations, but each memory unit of the flash memory includes a complex structure of a controlled gate and a floating gate which results in the high cost of the flash memory and a complicated hardware circuit. In comparison, the OTP memory can only be written once, and the theory of data storage utilizes high voltage to write-in data, and the data cannot be erased once the data is written in, therefore the covered housing of the OTP memory has no transparent window installed. Hence the cost of the OTP memory is lower and the hardware circuit is less complicated.

Figure 1:
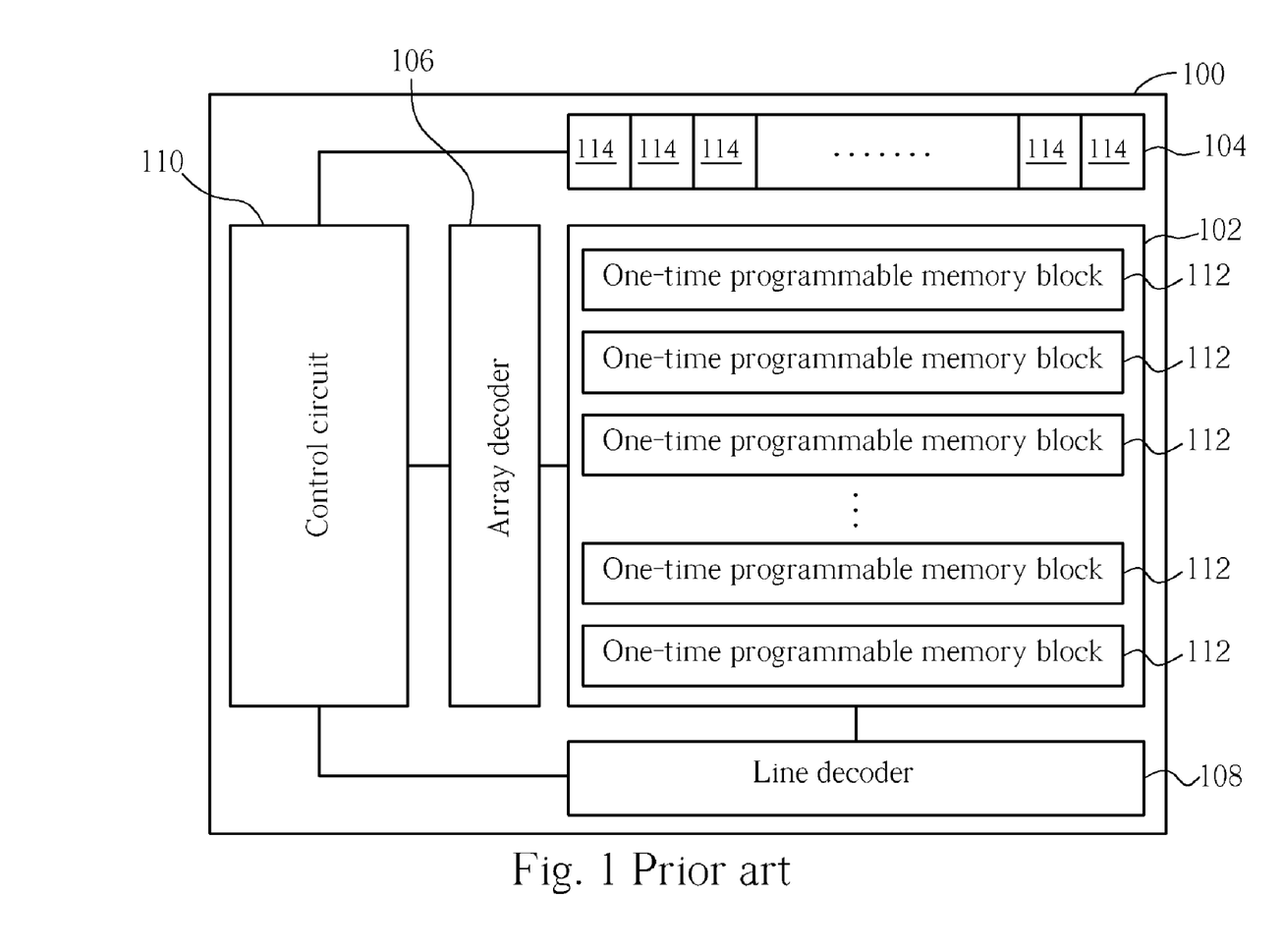
FIG. 1 illustrates a functional block diagram of a conventional memory.

OTP memory includes characteristics like lower cost and a less complicated circuit, therefore the prior art provides an apparatus that can realize an OTP memory to perform multi-programmable function. Generally, this type of OTP memory is widely adopted in all kinds of electronic products such as digital cameras, mobile phones, game consoles, and personal digital assistants (PDA) for storing data that is not updated such as firmware. Please refer to FIG. 1. FIG. 1 illustrates a functional block diagram of a conventional memory 100. The memory 100 is capable of performing multi-programmable function with one-time programmable (OTP) memory and includes a OTP memory array 102, an initial address indicator 104, an array decoder 106, a line decoder 108, and a control circuit 110. In the memory apparatus 100, the OTP memory array 102 includes N number of OTP memory blocks 112, each OTP memory block 112 includes M number of OTP memory units. In other words, the OTP memory array 102 includes N rows and M lines. Each OTP memory unit is utilized for recording a bit data, hence each OTP memory block 112 is capable of recording a word data of M bits. The initial address indicator 104 includes N number of memory units 114, each memory unit 114 corresponds to a OTP memory block 112 for recording whether the corresponding OTP memory block 112 is being utilized. Therefore, when the memory 100 reads a last word being recorded in the OTP array 102, the control circuit 110, according to data of the memory unit 114 of the initial address indicator 104, determines an address for storing the last word being recorded in the OTP memory block 112, and the array decoder 106 and the line decoder 108 decode the data required. When write in data, the control circuit 110 writes in data through the array decoder 106 and the line decoder 108 to an unutilized OTP memory block 112, and after data is written in, the memory unit 114 corresponding to the OTP memory block is set to utilized.

Therefore utilization is limited because the memory 100 is required to have an extra OTP memory unit utilized as the initial address indicator 104 to indicate the address of the utilized OTP memory block 112. Additionally, the memory count of the memory 100 is limited only by the count of the OTP memory block 112.

SUMMARY OF THE INVENTION

The main objective of the claimed invention is to provide a method and apparatus for performing multi-programmable function with one-time programmable (OTP) memory.

The claimed invention discloses a method for performing multi-programmable function with a OTP memory, the method comprises the following steps: generating a new word in a OTP memory array, receiving a word-to-be-recorded, comparing the new word and the word-to-be-recorded, and recording bit information between the new word and the word-to-be-recorded into the OTP memory array according to comparison results.

The claimed invention further discloses an apparatus for performing multi-programmable function with OTP memory, the apparatus comprises a OTP memory array comprising a plurality of one time programmable memory blocks, each OTP memory block comprises a plurality of OTP memory units for recording a word length data, a first register coupled to the OTP memory array for registering a word data, a second register for registering a word data, a first change over circuit coupled to the first register and the second register for comparing the word data registered by the first register and the word data registered by the second register and for storing the comparison result to the second register, a third register for registering a word data, and a second change over circuit coupled to the first register, the second register, and the third register for comparing the word data registered by the second register and the word data registered by the third register and for storing the comparison result to the first register.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
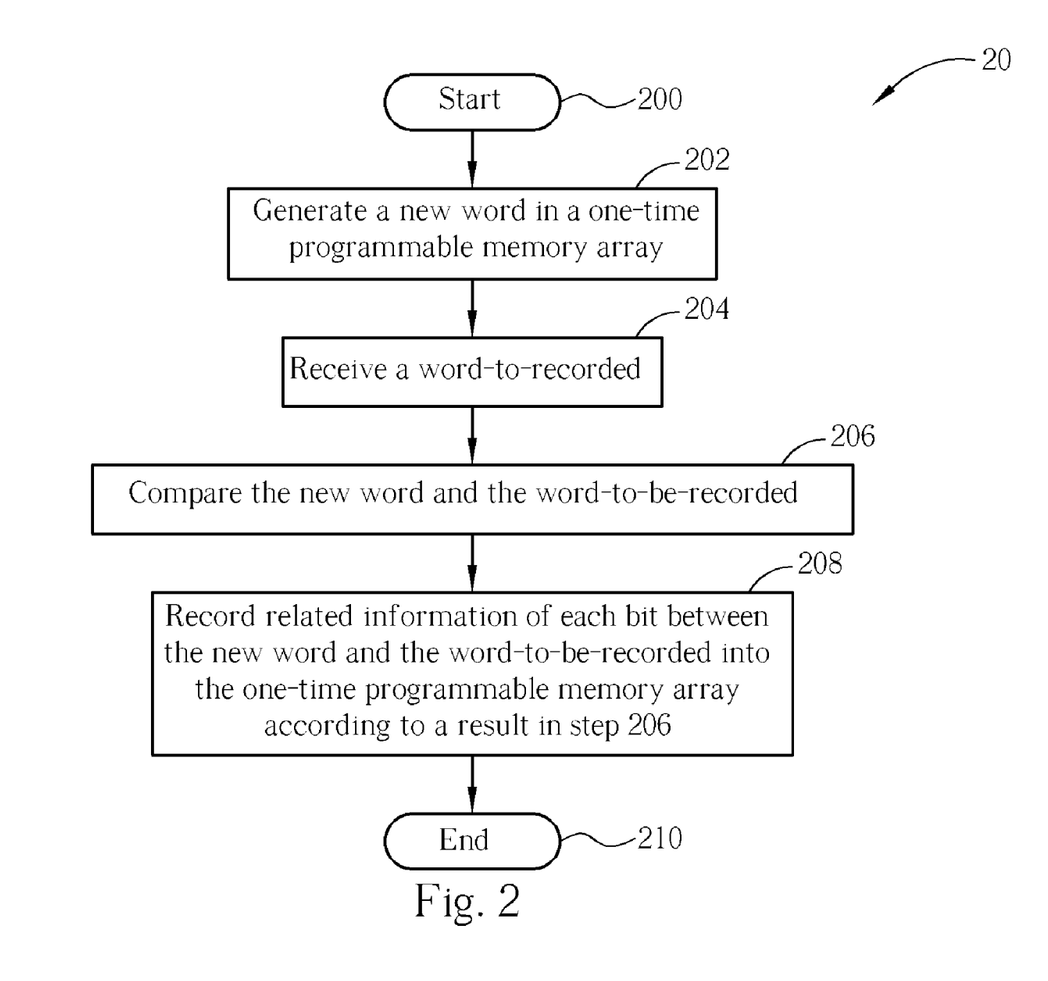
FIG. 2 illustrates a flowchart of performing multi-programmable function with a one-time programmable memory according to the present invention.

Please refer to FIG. 2. FIG. 2 illustrates a flowchart of a flow 20 according to the present invention. The flow 20 is capable of performing multi-programmable function with a one-time programmable memory, the flow includes the following steps:

Step 200: start;

Step 202: generate a new word in a OTP memory array;

Step 204: receive a word-to-recorded;

Step 206: compare the new word and the word-to-be-recorded;

Step 208: record related information of each bit between the new word and the word-to-be-recorded into the OTP memory array according to a result in step 206;

Step 210: end.

In the flow 20, the OTP memory array includes a plurality of OTP memory blocks. Each OTP memory block is utilized for recording data of a word length; each OTP memory block includes a plurality of OTP memory units for recording a bit of data. In general, a bit value recorded by the OTP memory unit is preset to 1, and can only write in bit 0 once. Furthermore, a new word refers to a new data stored within the OTP memory array. According to the flow 20, when the present invention is write in a word-to-recorded, a new word is first obtained from a OTP memory array, and each bit of the word-to-recorded and the new word are being compared. Lastly, according to the result, related information of each bit between the new word and the word-to-be-recorded is recorded into the OTP memory array, which also means recording the relationship of each bit between the new word and the word-to-be-recorded into the OTP memory array. Therefore, in the OTP memory array, the data recorded in each OTP memory block is not a word data but a relationship between words. Hence, the present invention is capable of reducing addressing operations, which directly reduces the production cost of the hardware.

Figure 3:
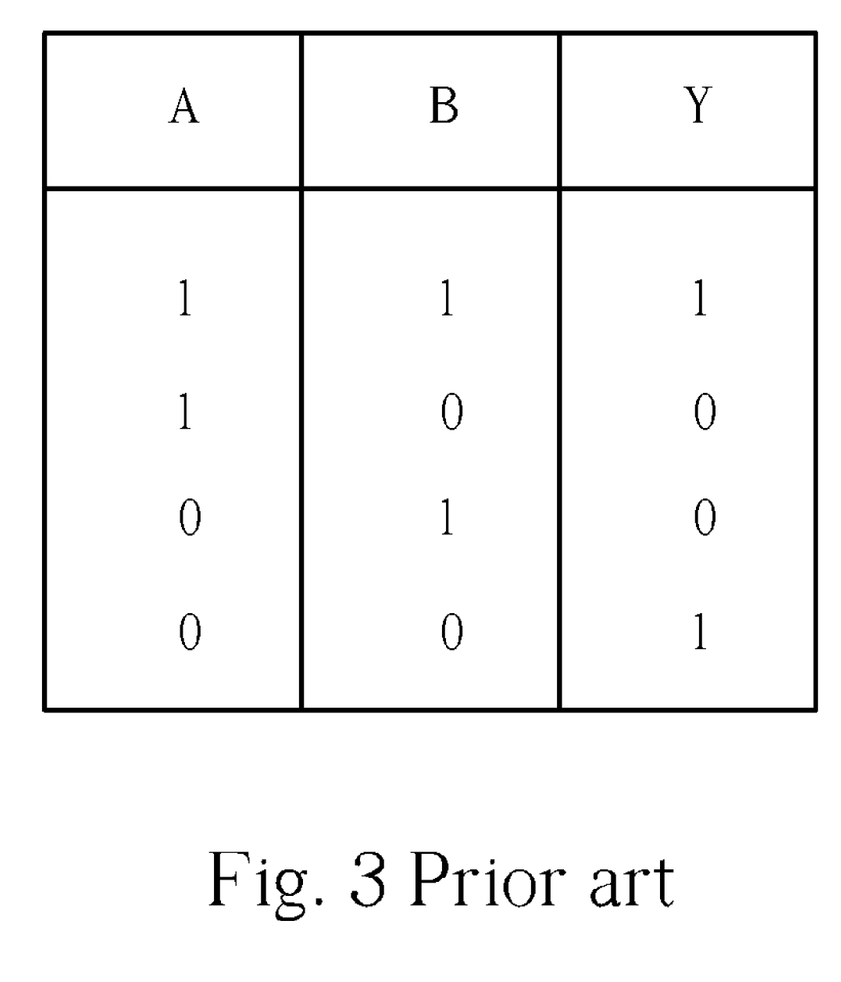
FIG. 3 illustrates a chart of a conventional exclusive-OR operation.

For example, the present invention can record information concerning the difference between the bits of the word-to-be-recorded and the bits of the new word. The present invention can record this information into the OTP memory array. In other words, the OTP memory array only records data conversion between the word-to-be-recorded and the new word. When the data conversion exists between words, the related information is then recorded into the OTP memory array, when there is no data conversion between words, there is no following write in operation. For hardware, as the OTP memory only records the data conversion between words, which means that when a bit between words is different, only then information of the bit having data conversion is recorded, therefore an exclusive-OR operation is utilized to compare words. Please refer to FIG. 3. FIG. 3 illustrates a chart of a conventional exclusive-OR operation. In FIG. 3, a column A and a column B are input values, a column Y is an output value. When the input values are identical to one another (either being both 1's or both 0's), the output is 1, and when the input values are different, then the output is 0.

Figure 4:
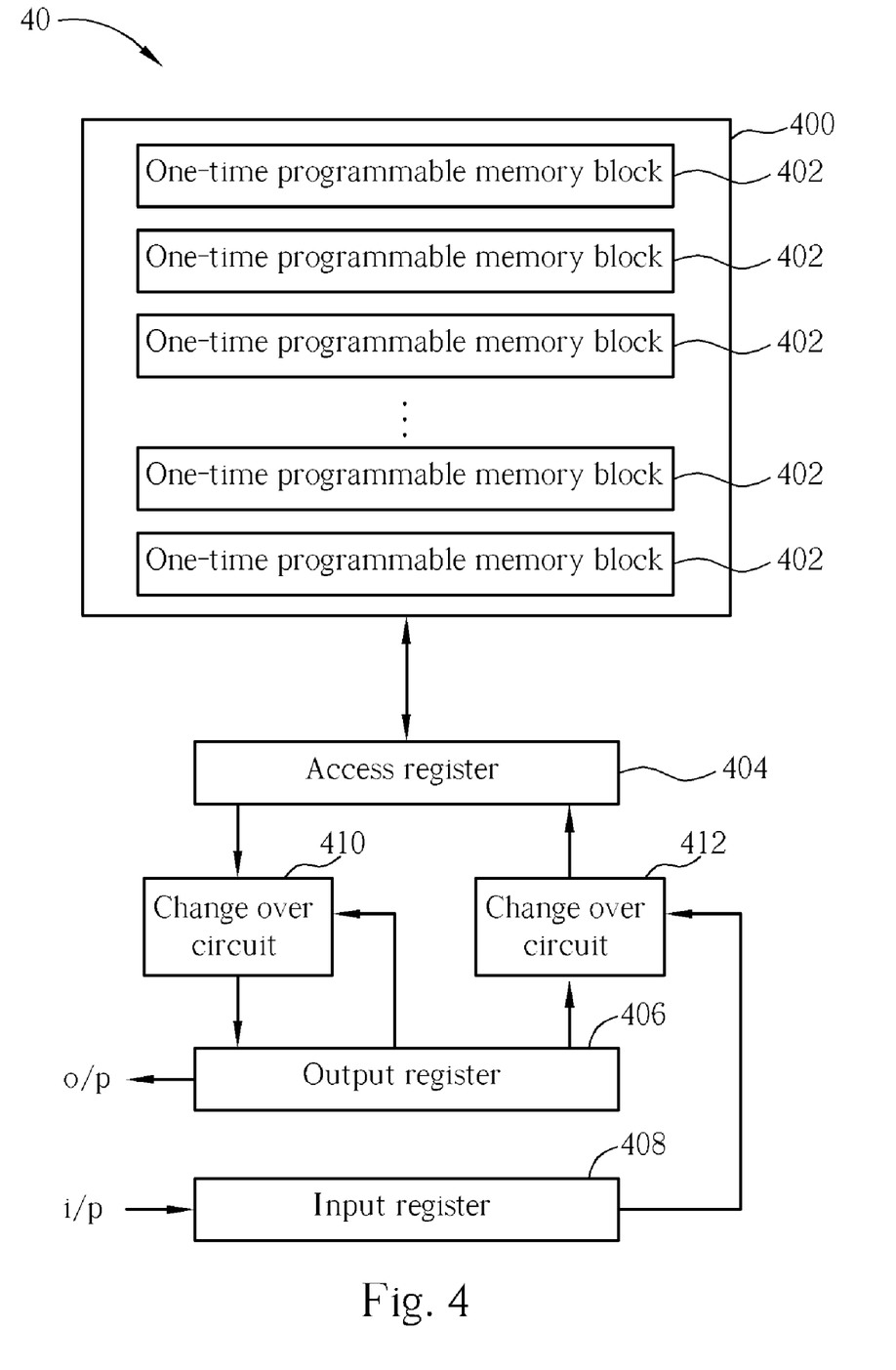
FIG. 4 illustrates a diagram of a memory for performing multi-programmable function with a one-time programmable memory according to a preferred embodiment of the present invention.

Please refer to FIG. 4. FIG. 4 illustrates a diagram of a memory 40 for performing multi-programmable function with a one time programmable memory according to a preferred embodiment of the present invention. The memory 40 includes a OTP memory array 400, an access register 404, an output register 406, an input register 408, and change over circuits 410, 412. The OTP memory array 400 includes a plurality of OTP memory blocks 402, and each OTP memory block is capable of recording a word length data. The access register 404, the output register 406 and the input register 408, each is utilized respectively for registering a word length data, wherein the output register 406 and the input register 408 can be realized by a register capable of multiplex functions. The change over circuits 410, 412 are preferably exclusive-OR operational circuits for calculating logic as shown in FIG. 3, which means that when the input values are different, the output is 0, and when the input values are identical, then the output is 1. The input terminals of the change over circuit 410 are coupled to the access register 404 and the output register 406, and the output terminal of the change over circuit 410 is coupled to the output register 406 for executing the exclusive-OR operation on data stored within the access register 404 and the output register 406 and for storing the result into the output register 406. The input terminals of the change over circuit 412 are coupled to the output register 406 and the input register 408, and an output terminal of the change over circuit 412 is coupled to the access register 404 for executing the exclusive-OR operation on data stored within the output register 406 and the input register 408 and for storing the result into the access register 404. Furthermore, the change over circuit 410 and the change over circuit 412 can be realized by an exclusive-OR operational circuit, and the circuits 410, 412 can switch to the exclusive-OR operational circuit function according to the execution functions required (e.g., read in or write in).

Therefore, when the data of the OTP memory array 400 is read in, the access register 404 reads and registers data of a OTP memory block 402, and then after the change over circuit 410 performs the exclusive-OR operation on the word stored in the access register 404 and the word stored in the output register 406, the result is then stored in the output register 406. Next, the exclusive-OR operation is performed on the word recorded in each OTP memory block 402 and the word recorded in the output register 406 sequentially to obtain a new word, and lastly, the new word is generated.

On the contrary, when data is written in to the OTP memory array 400, a word-to-be-recorded is obtained from the input register 408, then the change over circuit 412 performs the exclusive-OR operation on the word stored in the input register 408 and the word stored in the output register 406, the result is then stored in the access register 404. Lastly, the data stored in the access register 404 is write in to an unutilized OTP memory block 402.

Figure 5:
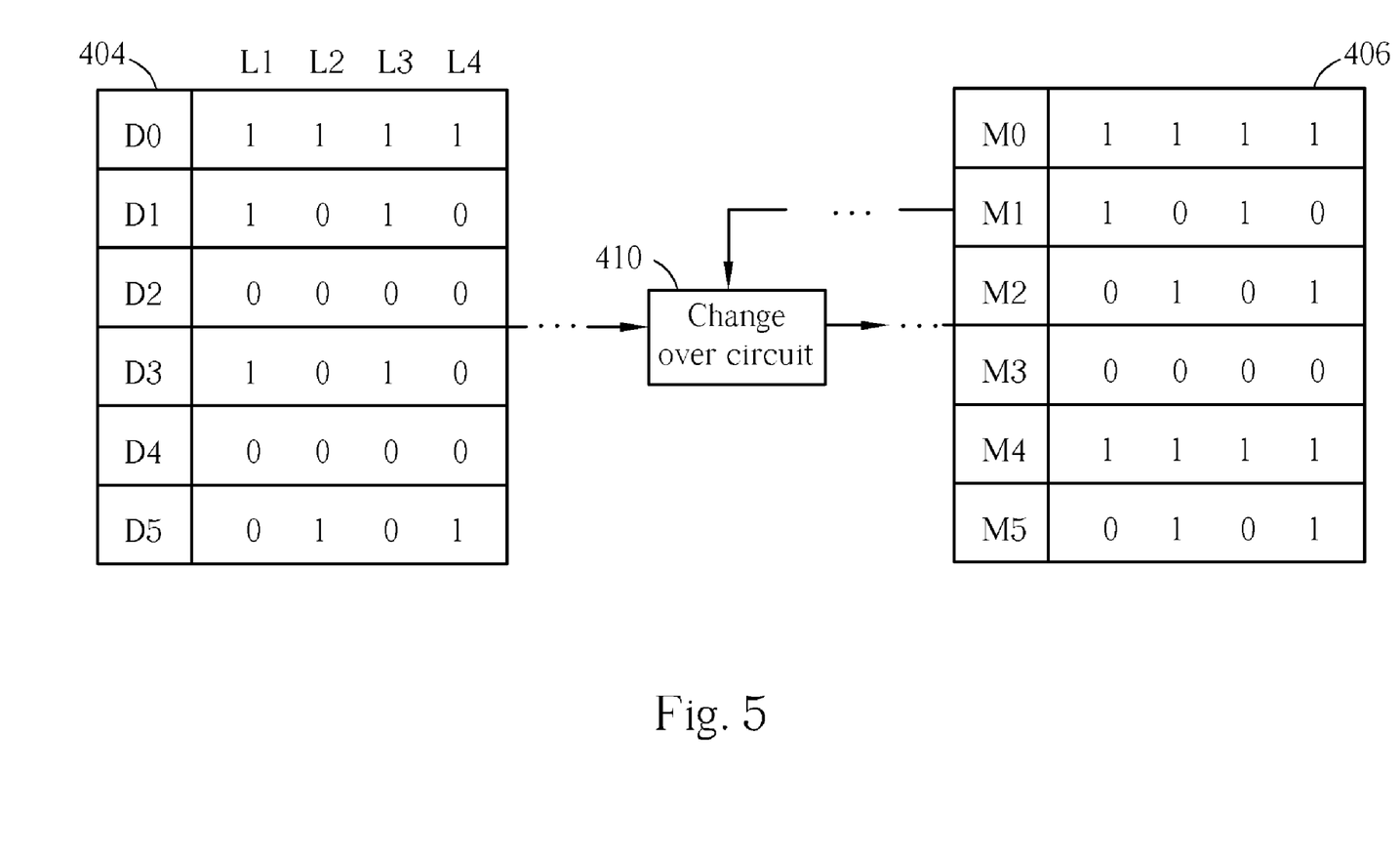
FIG. 5 illustrates a diagram of when the memory of FIG. 4 is reading.

As for a read in function, please refer to FIG. 5. If the OTP memory array 400 includes five OTP memory blocks 402, and each OTP memory block 402 includes four OTP memory units, therefore each OTP memory block 402 is capable of recording four bits. In FIG. 5, lines D0 to D5 are data recorded in each OTP memory block 402 of the OTP array 400, wherein the line D0 is an initial word of the OTP array 400, and lines M1 to M5 are data of the output register 406 where line M0 is an initial data of the output register 406. The line M1 is a result of the execution of the exclusive-OR operation on lines D1 and M0, and the line M2 is a result of the execution of an exclusive-OR operation on lines D2 and M1, and so forth. In other words, the OTP memory array 400 only records the data conversion between words so that each data of the output register 406 is related to a previous data. Therefore when a new word is outputted, the present invention reads the data recorded in the OTP memory block 402 sequentially, after the exclusive-OR operation is performed, the result is then outputted.

Figure 6:
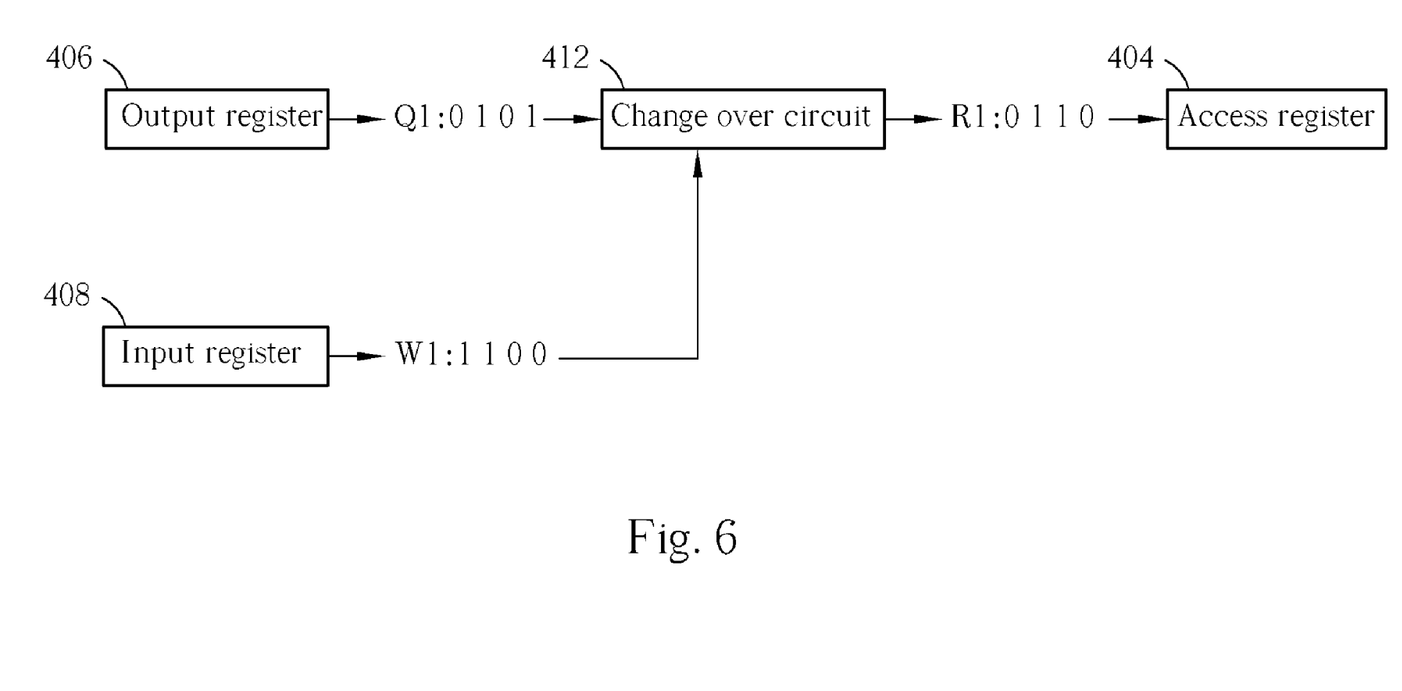
FIG. 6 illustrates a diagram of when the memory of FIG. 4 is writing.

In contrary, when write in, the present invention compares conditions of each bit data conversion between the word-to-be-recorded and the new word, the bit that has data conversion is recorded as 0. For example, please refer to FIG. 6, if word data stored within the output register 406 is Q1 (0, 1, 0, 1) and word data stored within the input register 406 is W (1, 1, 0, 0), after the change over circuit 412 performs the exclusive-OR operation on each bit of word data Q1 and word data W1, word data R1 (0, 1, 1, 0) is outputted to the access register 404. Lastly, the access register 404 writes in the word data R1 to an unutilized OTP memory block 402.

Therefore, by utilizing the memory 40, the present invention can realize multi-programmable memory function with an OTP memory. The write in and read out function of the memory 40 can be activated through a read out module and a write in module. In comparison to the prior art, the present invention does not require an extra initial address indicator to record whether the OTP memory block is utilized, hence the present invention can economize the use of the hardware circuit. At the same time, the data recorded in the OTP memory array in the present invention is a data conversion, hence the present invention can further economize the use of OTP memory block. Please refer to the following explanation. Firstly, in FIG. 5, the bit 0 within the OTP memory block represents a data conversion, therefore by accumulating bit counts of lines L1 to L4, which means that each bit of data row M5 required can be determined. For example, there are three bit 0 in the line L1, which represents an initial bit that is being data converted three times, hence the first bit value of the row M5 is 0. Otherwise, by determining whether the bit 0 count of lines L1 to L4 is an odd count, if so, the corresponding output bit is set to 0, if not 1. As each bit of the new word required is only related to the corresponding bit 0 count of a line, therefore the sequence of the data between rows will not affect the output result. When the word-to-be-recorded has a data conversion bit, the present invention can write in a bit 0 to a corresponding unutilized OTP memory unit. Otherwise, the memory count of the present invention is not limited to the count of the OTP memory block, and saturation can be achieved by write in bit 0 to each OTP memory unit of a line. In FIG. 5, although all the OTP memory block (D0 to D5) of the OTP memory array are being utilized, there is at least a OTP memory unit of each line (L1 to L4) not being utilized, therefore the OTP memory array can be recorded again.

In conclusion, the present invention provides a method and apparatus for performing multi-programmable function with OTP memory, which can reduce production costs of additional memory units and simplify the hardware circuit. Furthermore, in the present invention, the memory count is not limited to the OTP memory block count, hence the present invention overcomes the defect of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing multi-programmable function with a one-time programmable (OTP) memory, the method comprising the following steps:
   (a) generating a new word in a OTP memory array;
   (b) receiving a word-to-be-recorded;
   (c) comparing the new word and the word-to-be-recorded; and
   (d) recording bit information between the new word and the word-to-be-recorded into the OTP memory array according to a result in step (c).

2. The method of claim 1 wherein the OTP memory array comprises a plurality of OTP memory blocks, each programmable memory block is utilized for recording data of each word length.

3. The method of claim 1 wherein step (a) comprises generating the newest bits of the new word according to the count of bits having values equal to a predetermined value in a corresponding position of the OTP memory array.

4. The method of claim 3 wherein the predetermined value is 0.

5. The method of claim 3 wherein step (a) comprises generating the newest bit of the new word according to whether an odd count of bits having values equal to a predetermined value in a corresponding position of the OTP memory array.

6. The method of claim 1 wherein step (c) comprises performing an exclusive-OR operation on the word to-be-recorded and the new word.

7. The method of claim 6 wherein step (d) comprises storing the result of step (c) into the OTP memory array.

8. The method of claim 1 further comprising outputting the new word.

9. An apparatus for performing multi-programmable function with one-time programmable (OTP) memory, the apparatus comprising:
   a OTP memory array comprising a plurality of one time programmable memory blocks, each OTP memory block comprising a plurality of one time-programmable memory units for recording a word length data;
   a first register coupled to the OTP memory array for registering a word data;
   a second register for registering a word data;
   a first change over circuit coupled to the first register and the second register for comparing the word data registered by the first register and the word data registered by the second register and for storing the comparison result to the second register;
   a third register for registering a word data; and
   a second change over circuit coupled to the first register, the second register, and the third register for comparing the word data registered by the second register and the word data registered by the third register and for storing the comparison result to the first register.

10. The apparatus of claim 9 wherein when read in, the second register outputs a new word.

11. The apparatus of claim 9 wherein when write in, data stored in the first register is write in into the OTP memory array.

12. The apparatus of claim 11 wherein when write in, the data stored in the first register is write in into an unutilized OTP memory unit of the OTP memory array.

13. The apparatus of claim 9 wherein each bit of an initial word of the OTP memory array is 1.

14. The apparatus of claim 9 wherein each bit of the initial word of the second register is 1.

15. The apparatus of claim 9 wherein the second register and the third register are realized by a multiplex function register.

16. The apparatus of claim 9 wherein the first change over circuit and the second change over circuit are realized by a multiplex function change over circuit.

17. The apparatus of claim 9 wherein the first change over circuit compares the word data stored in the first register and the word data stored in the second register and records the difference of the bit values between the word data stored in the first register and the word data stored in the second register into the second register.

18. The apparatus of claim 17 wherein the first change over circuit records the different bits information as a first value.

19. The apparatus of claim 18 wherein the first value is 0.

20. The apparatus of claim 9 wherein the first change over circuit performs an exclusive-OR operation on the word data stored in the first register and the word data stored in the second register and stores the operation result into the second register.

21. The apparatus of claim 9 wherein the second change over circuit compares the word data stored in the second register and the word data stored in the third register and records the difference of the bit values between the word data stored in the second register and the word data stored in the third register into the first register.

22. The apparatus of claim 21 wherein the second change over circuit records the difference of the bit values as a first value.

23. The apparatus of claim 22 wherein the first value is 0.

24. The apparatus of claim 9 wherein the second change over circuit performs an exclusive-OR operation on the word data stored in the second register and the word data stored in the third register and stores the operation result into the first register.

* * * * *